United States Patent
Kim et al.

(10) Patent No.: US 10,475,821 B2
(45) Date of Patent: Nov. 12, 2019

(54) TFT SUBSTRATE MANUFACTURING METHOD AND TFT SUBSTRATE

(71) Applicant: Wuhan China Star Optoelectronics Technology Co., Ltd., Wuhan (CN)

(72) Inventors: Wonjoong Kim, Wuhan (CN); Lin Meng, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 53 days.

(21) Appl. No.: 15/529,510

(22) PCT Filed: Apr. 11, 2017

(86) PCT No.: PCT/CN2017/080080
§ 371 (c)(1),
(2) Date: May 25, 2017

(87) PCT Pub. No.: WO2018/166022
PCT Pub. Date: Sep. 20, 2018

(65) Prior Publication Data
US 2018/0308864 A1  Oct. 25, 2018

(30) Foreign Application Priority Data
Mar. 17, 2017  (CN) .......................... 2017 1 0162222

(51) Int. Cl.
*H01L 27/12* (2006.01)
*H01L 29/417* (2006.01)
(Continued)

(52) U.S. Cl.
CPC .......... *H01L 27/124* (2013.01); *H01L 27/127* (2013.01); *H01L 27/1262* (2013.01);
(Continued)

(58) Field of Classification Search
CPC ............... H01L 27/124; H01L 27/1214; H01L 27/1259; H01L 27/1288; H01L 27/1262;
(Continued)

(56) References Cited

U.S. PATENT DOCUMENTS

2003/0124863 A1  7/2003  Hwang et al.
2010/0187537 A1*  7/2010  Lin ...................... H01L 27/124
                                                        257/72
(Continued)

FOREIGN PATENT DOCUMENTS

CN            1808709 A    7/2006
CN          102487041 A    6/2012

*Primary Examiner* — Sonya D. McCall-Shepard
(74) *Attorney, Agent, or Firm* — Leong C. Lei

(57) ABSTRACT

The present invention provides a TFT substrate manufacturing method and a TFT substrate. In the TFT substrate manufacturing method of the present invention, a pattern of the gate metal layer has been designed such that reflective blocks are included in a gate metal layer at locations corresponding to areas in which connection holes are to be formed so that in a process of forming the connection holes, light is reflected by the reflective blocks to enhance intensity of exposure on locations where the connection holes are formed. Thus, even under the condition that limit exposure size of an existing exposure machine is constrained, it is still possible to ensure full exposure in forming the connection holes in a high PPI display panel device to thereby realize production of high display panel products.

8 Claims, 5 Drawing Sheets

(51) Int. Cl.
*H01L 29/423* (2006.01)
*H01L 29/786* (2006.01)

(52) U.S. Cl.
CPC .... *H01L 27/1288* (2013.01); *H01L 29/41733* (2013.01); *H01L 29/42384* (2013.01); *H01L 29/786* (2013.01)

(58) Field of Classification Search
CPC ......... H01L 29/41733; H01L 29/42384; H01L 27/127; H01L 29/786
See application file for complete search history.

(56) References Cited

U.S. PATENT DOCUMENTS

2016/0225801 A1\* 8/2016 Yun ................. H01L 27/1288
2016/0254273 A1\* 9/2016 Yu .................. G02F 1/136286
257/72

\* cited by examiner

TFT SUBSTRATE MANUFACTURING METHOD AND TFT SUBSTRATE

BACKGROUND OF THE INVENTION

1. Field of the Invention

The present invention relates to the field of display technology, and more particular to a thin-film transistor (TFT) substrate manufacturing method and a TFT substrate.

2. The Related Arts

Nowadays, there are more and more display devices using a thin-film transistor (TFT) array substrate to drive pixels in order to achieve displaying on a display device. As a primary structural component of contemporary display devices to provide a drive circuit to the display devices, the TFT array substrate is generally provided with a plurality of gate scan lines and a plurality of data lines. The plurality of gate scan lines and the data lines collectively define a plurality of pixel units. Each of the pixel units is provided therein with a thin-film transistor device and a pixel electrode such that a gate electrode of the thin-film transistor is connected to a corresponding one of the gate scan lines. When a voltage applied to the gate scan line reaches a turn-on voltage, a source electrode and a drain electrode of the thin-film transistor are conducted to each other so as to supply a data voltage fed through the data line to the pixel electrode to control displaying of a corresponding pixel area. A conventional structure of the pixel units of the TFT array substrate generally comprises, stacked in sequence from bottom to top, a backing plate, a semiconductor layer, an oxide layer, a gate metal layer, a first insulation layer, a second insulation layer, a source/drain metal layer, an insulation protection layer, and the pixel electrode, in which for the purpose of connection between two of the layers, a connection hole must be formed in the pixel unit to achieve for example connection between the source and drain electrodes and an active layer and connection between the pixel electrode and the drain electrode.

With the development of 4K and 8K display devices, people are demanding higher and higher resolution and high pixels per inch (PPI) is becoming a primary direction of development for the display industry. Display manufacturers are now challenging themselves with products with more than 800 PPI. In such a condition, the size of the connection hole of a TFT device must be made extremely small, such as 1 um. Heretofore, patterning art is primarily used for making a connection hole of a TFT device. Specifically, a mask plate is positioned above a substrate on which photo resist (PR) is coated and an exposure machine is used to subject the substrate to exposure. Specifically, the exposure machine is operated by activating an ultrahigh voltage mercury lamp to emit ultraviolet (UV) light to transfer image information of the mask to a surface of the substrate on which the photo resist is coated. Based on the pattern of the mask, the photo resist would become an exposed portion and an unexposed portion. A development agent is then applied to subject the photo resist to development in order to remove the exposed portion of the photo resist, while the unexposed portion of the photo resist is preserved (for positive photo resist) so that a desired pattern is formed on the photo resist. Afterwards, the preserved photo resist is used as a shield to subject the substrate to etching so as to form a connection hole. Heretofore, a Nikon exposure machine is commonly used in this industry to conduct an exposure process of an array substrate and due to constraint by the limit exposure size (the limit exposure size being 2 um) available for the exposure machine, in an exposure process applied to making a connection hole in an ultrahigh PPI display panel device, the photo resist often suffers insufficiency of exposure and is thus cannot be removed through development and this leads to defects of products. As shown in FIG. 1, a photo resist layer 300 is coated on a material layer 200 to be etched. A mask 500 arranged above the photo resist layer 300 has a pattern precision of 1 μm, while the limit exposure size of the exposure machine is 2 μm. A part of the photo resist layer 300 corresponding to a light transmitting pattern 501 of the mask 500 would be of insufficient exposure so that after development with a development agent, the photo resist layer 300 would be such that the part of insufficient exposure could not be completely removed through the development and consequently, it would not be possible to conduct etching for patterning of the material layer 200 to be etched Thus, it is urgently desired to provide a novel TFT substrate manufacturing method to suit the need of an exposure process for a connection hole of an ultrahigh PPI display panel device.

SUMMARY OF THE INVENTION

Objectives of the present invention are to provide a thin-film transistor (TFT) manufacturing method, which ensures sufficient exposure in forming a connection hole in a high PPI display panel device so as to realize production of high PPI display panel products.

The objectives of the present invention are also to provide a TFT substrate, which ensures sufficient exposure in forming a connection hole in a high PPI display panel device so as to realize production of high PPI display panel products.

To achieve the above objectives, the present invention provides a TFT substrate manufacturing method, which comprises the following steps:

a step of forming a gate metal layer through deposition and patterning, wherein the gate metal layer comprises a gate electrode and reflective blocks, and the reflective blocks and the gate electrode are not connected;

a step of forming an insulation layer on the gate metal layer;

a step of forming a photoresist resin layer through forming a complete sheet of photoresist resin film on an entire surface of the insulation layer through coating and subjecting the layer of photoresist resin film to exposure and development, wherein portions of the photoresist resin film that are located above and corresponding to the reflective blocks are exposed and form a first via and a second via; and a step of forming a first connection hole and a second connection hole by applying etching in the first via and the second via with the photoresist resin layer as a shielding layer.

The TFT substrate manufacturing method specifically comprises the following steps:

Step 1: providing a backing plate and sequentially forming a buffer layer, a semiconductor layer, and an oxide layer on the backing plate;

Step 2: forming the gate metal layer on the oxide layer 13 through deposition and patterning;

Step 3: sequentially forming a first insulation layer and a second insulation layer on the oxide layer and the gate metal layer to form an insulation layer that comprises the first insulation layer and the second insulation layer;

Step 4: forming a complete sheet of photoresist resin film on an entire surface of the second insulation layer through coating, and providing a mask plate, wherein the mask plate comprises light transmission zones and a light shielding zone, wherein the mask plate is used to subject the layer of photoresist resin film to exposure, so that in the exposure process, the reflective blocks correspond to the light transmission zones of the mask plate to allow light to transmit through the light transmission zones of the mask plate to subject the photoresist resin film to exposure, whereby a portion of the photoresist resin film located above and corresponding to each of the reflective blocks is exposed and the reflective block reflects the light to increase exposure intensity of the portion of the photoresist resin film located thereabove; and then, subjecting the exposed photoresist resin film to development, so that the exposed portions of the photoresist resin film that are located above the reflective blocks are removed to form a first via and a second via located above and corresponding to the reflective blocks to form a photoresist resin layer;

Step 5: using the photoresist resin layer as a shielding layer to subject the second insulation layer, the first insulation layer, the gate metal layer, and the oxide layer located under the first via and the second via to etching through an etching operation so as to form a first connection hole and a second connection hole extending through the second insulation layer, the first insulation layer, the gate metal layer, and the oxide layer and respectively corresponding to the first via and the second via; and Step 6: forming a source electrode and a drain electrode on the second insulation layer through deposition and patterning operation, wherein the source electrode and the drain electrode are connected to the semiconductor layer through the first connection hole and the second connection hole, respectively.

The gate metal layer is formed of a material comprising one of molybdenum, titanium, aluminum, and copper or a stacked combination of multiple ones thereof.

The step of forming a gate metal layer, the patterning of the gate metal layer comprises carrying out, in sequence, a photo resist coating process, an exposure process, a development process, an etching process, and a photo resist peeling process.

In the step of forming a first connection hole and a second connection hole, the first connection hole and the second connection hole extend through the insulation layer and the gate metal layer.

The present invention also provides a TFT substrate, which is provided with a first connection hole and the second connection hole and comprises a gate metal layer and an insulation layer arranged on the gate metal layer;

wherein the gate metal layer comprises a gate electrode and reflective blocks arranged at locations corresponding to the first connection hole and the second connection hole and the reflective blocks and the gate electrode are not connected; and wherein the reflective blocks function to reflect light to enhance exposure intensity on portions located thereabove in a process of forming the first connection hole and the second connection hole.

The TFT substrate specifically comprises the backing plate, a buffer layer arranged on the backing plate, a semiconductor layer arranged on the buffer layer, an oxide layer arranged on the buffer layer and the semiconductor layer, the gate metal layer arranged on the oxide layer, a first insulation layer arranged on the oxide layer and the gate metal layer, a second insulation layer arranged on the first insulation layer, and a source electrode and a drain electrode arranged on the second insulation layer; the first insulation layer and the second insulation layer collectively form an insulation layer;

wherein the first connection hole and the second connection hole extend through the second insulation layer, the first insulation layer, the gate metal layer, and the oxide layer at locations above the semiconductor layer and corresponding to reflective blocks and the source electrode and the drain electrode are respectively connected to the semiconductor layer via the first connection hole and the second connection hole.

The gate metal layer is formed of a material comprising one of molybdenum, titanium, aluminum, and copper or a stacked combination of multiple ones thereof.

The gate metal layer is formed through a patterning operation and the patterning operation comprises a photo resist coating process, an exposure process, a development process, an etching process, and a photo resist peeling process that are carried out in sequence.

The first connection hole and the second connection hole extend through the insulation layer and the gate metal layer.

The present invention further provides a TFT substrate manufacturing method, which comprises the following steps:

a step of forming a gate metal layer through deposition and patterning, wherein the gate metal layer comprises a gate electrode and reflective blocks, and the reflective blocks and the gate electrode are not connected;

a step of forming an insulation layer on the gate metal layer;

a step of forming a photoresist resin layer through forming a complete sheet of photoresist resin film on an entire surface of the insulation layer through coating and subjecting the layer of photoresist resin film to exposure and development, wherein portions of the photoresist resin film that are located above and corresponding to the reflective blocks are exposed and form a first via and a second via; and a step of forming a first connection hole and a second connection hole by applying etching in the first via and the second via with the photoresist resin layer as a shielding layer;

wherein the gate metal layer is formed of a material comprising one of molybdenum, titanium, aluminum, and copper or a stacked combination of multiple ones thereof; and wherein in the step of forming a gate metal layer, the patterning of the gate metal layer comprises carrying out, in sequence, a photo resist coating process, an exposure process, a development process, an etching process, and a photo resist peeling process.

The efficacy of the present invention is that the present invention provides a TFT substrate manufacturing method and a TFT substrate. In the TFT substrate manufacturing method, a pattern of the gate metal layer has been designed such that reflective blocks are included in a gate metal layer at locations corresponding to areas in which connection holes are to be formed so that in a process of forming the connection holes, light is reflected by the reflective blocks to enhance intensity of exposure on locations where the connection holes are formed. Thus, even under the condition that limit exposure size of an existing exposure machine is constrained, it is still possible to ensure full exposure in forming the connection holes in a high PPI display panel device to thereby realize production of high display panel products. In the TFT substrate of the present invention, a gate metal layer comprises reflective blocks at locations corresponding to connections holes so that in a process of forming the connection holes, light is reflected by the reflective blocks to enhance intensity of exposure on locations where the connection holes are formed. Thus, even under the condition that limit exposure size of an existing exposure machine is constrained, it is still possible to ensure full exposure in forming the connection holes in a high PPI display panel device to thereby realize production of high display panel products.

For better understanding of the features and technical contents of the present invention, reference will be made to the following detailed description of the present invention and the attached drawings. However, the drawings are provided only for reference and illustration and are not intended to limit the present invention.

BRIEF DESCRIPTION OF THE DRAWINGS

The technical solution, as well as other beneficial advantages, of the present invention will become apparent from the following detailed description of embodiments of the present invention, with reference to the attached drawings.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 1:
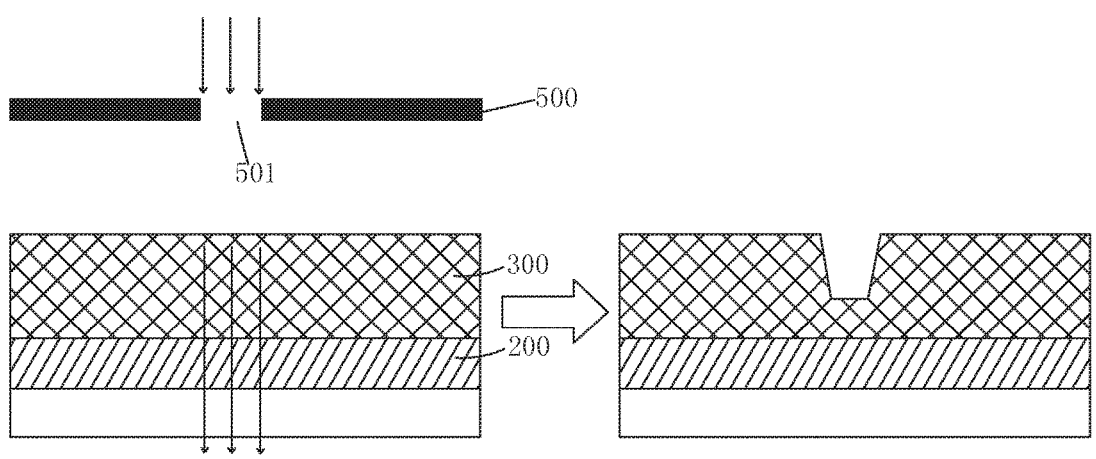
FIG. 1 is a schematic view demonstrating insufficient exposure of a photo resist layer in a conventional thin-film transistor (TFT) substrate manufacturing process resulting from a low limit exposure size of an exposure machine.
Figure 2:
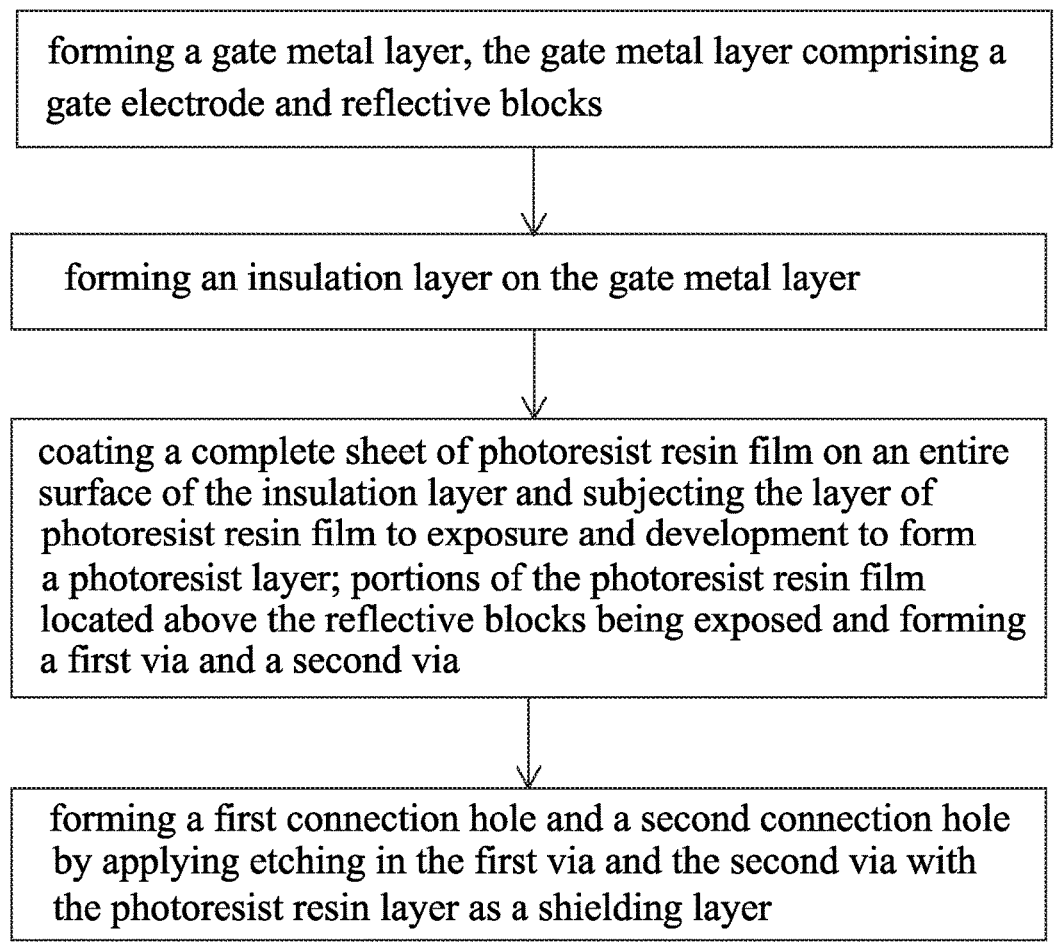
FIG. 2 is a flow chart illustrating a TFT substrate manufacturing method according to the present invention.
Figure 3:
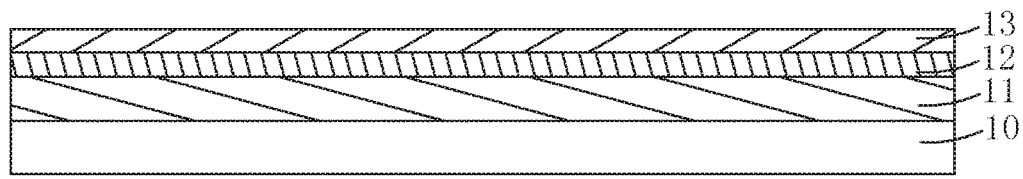
FIG. 3 is a schematic view illustrating Step 1 of a preferred example of a TFT substrate manufacturing method according to the present invention.

Referring to FIG. 2, firstly, the present invention provides a thin-film transistor (TFT) substrate manufacturing method. Compared to a conventional TFT substrate manufacturing method, the present invention provides a new design of a gate metal layer so that the gate metal layer is provided with a reflective block corresponding to an area in which a connection hole is formed in order to suit the need for an exposure process for a connection hole in a high PPI display panel device. References being also had to FIGS. 3-9, FIGS. 3-9 are schematic views respectively illustrating steps of a preferred example of the present invention. The preferred example comprises the following steps:

Step 1: as shown in FIG. 3, providing a backing plate 10 and sequentially forming a buffer layer 11, a semiconductor layer 12, and an oxide layer 13 on the backing plate 10.

Specifically, the buffer layer 11 comprises a silicon oxide ($SiO_2$) layer, a silicon nitride (SiNx) layer, or a composite layer formed of stacking silicon oxide layer and silicon nitride layer.

Figure 4:
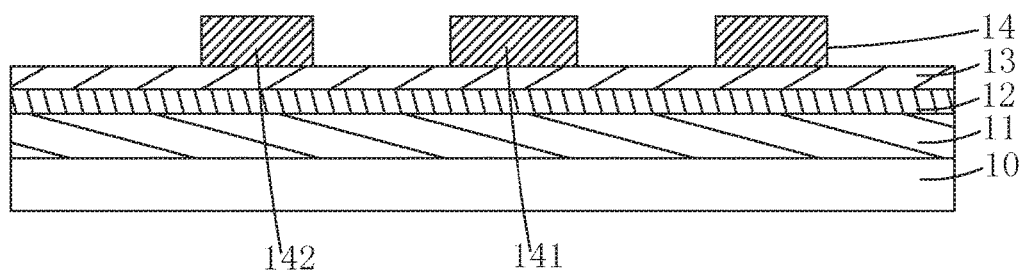
FIG. 4 is a schematic view illustrating Step 2 of the preferred example of the TFT substrate manufacturing method according to the present invention.

Step 2: as shown in FIG. 4, forming the gate metal layer 14 on the oxide layer 13 through deposition and patterning operation, wherein the gate metal layer 14 comprises a gate electrode 141 and reflective blocks 142 that are isolated such that the reflective blocks 142 are not connected to the gate electrode 141.

Specifically, the gate metal layer 14 is formed of a material comprising one of molybdenum, titanium, aluminum, and copper or a stacked combination of multiple ones thereof.

Specifically, in Step 2, the gate metal layer 14 formed through the patterning operation comprises conducting, in sequence, a photo resist coating process, an exposure process, a development process, an etching process, and a photo resist peeling process.

Figure 5:
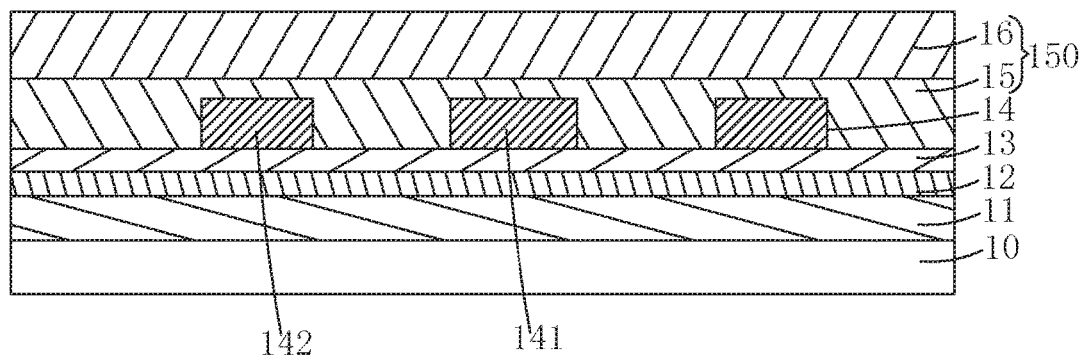
FIG. 5 is a schematic view illustrating Step 3 of the preferred example of the TFT substrate manufacturing method according to the present invention.

Step 3: as shown in FIG. 5, sequentially forming a first insulation layer 15 and a second insulation layer 16 on the oxide layer 13 and the gate metal layer 14 to form an insulation layer 150 that comprises the first insulation layer 15 and the second insulation layer 16.

Specifically, the first insulation layer 15 and the second insulation layer 16 are each a silicon oxide layer or a silicon nitride layer.

Figure 6:
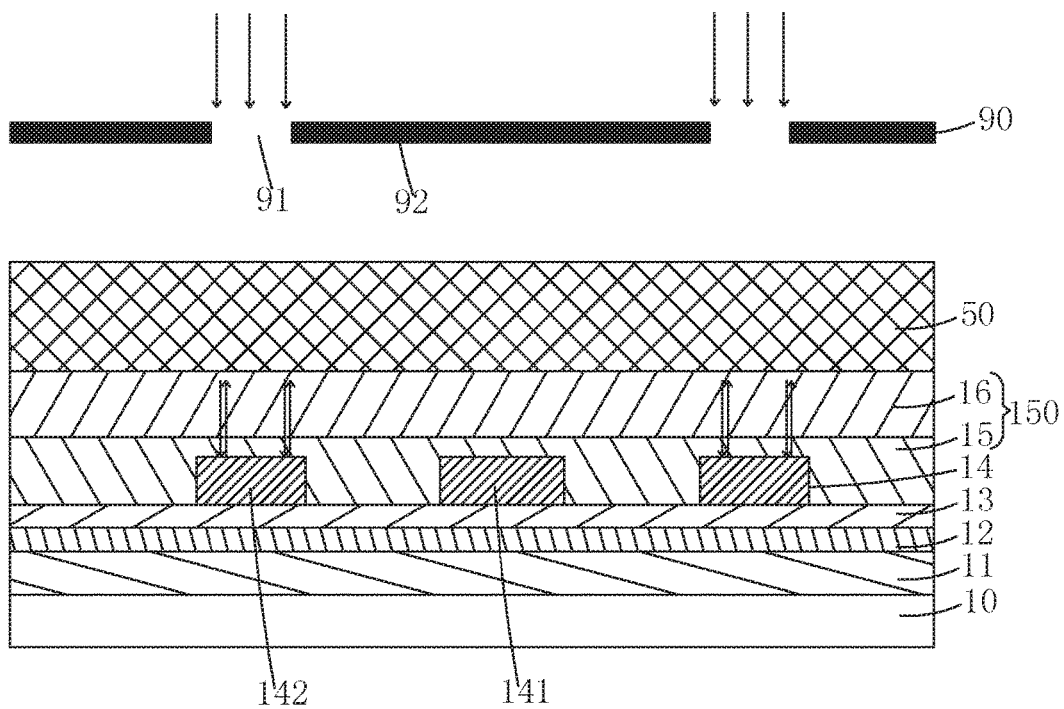
FIG. 6 is a schematic view illustrating exposure of a photo resist film in Step 4 of the preferred example of the TFT substrate manufacturing method according to the present invention.
Figure 7:
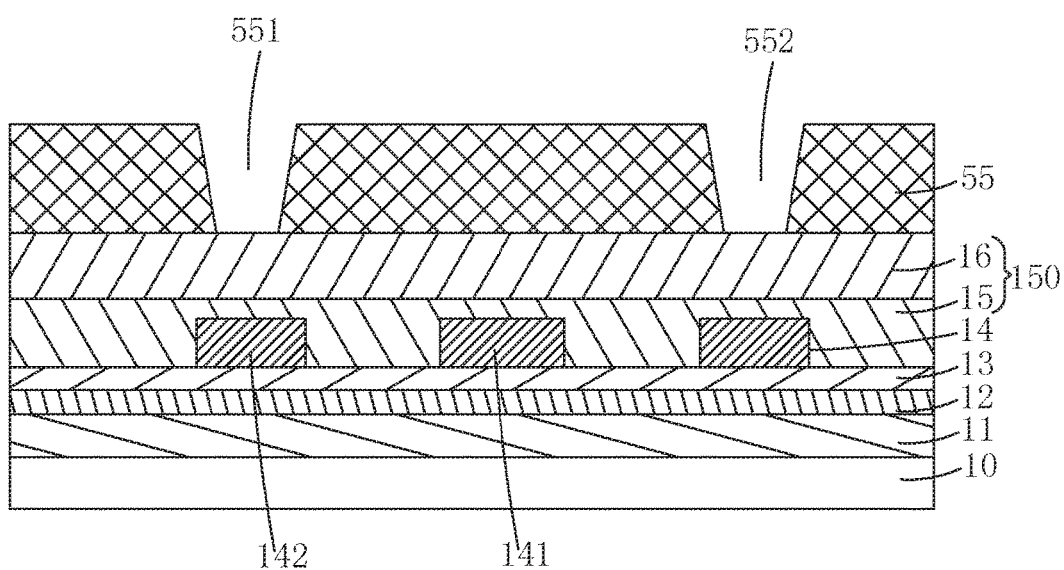
FIG. 7 is a schematic view illustrating development of the exposed photo resist film in Step 4 of the preferred example of the TFT substrate manufacturing method according to the present invention.

Step 4: as shown in FIG. 6, forming a complete sheet of photoresist resin film 50 on an entire surface of the second insulation layer 16 through coating, and providing a mask plate 90, wherein the mask plate 90 comprises light transmission zones 91 and a light shielding zone 92, wherein the mask plate 90 is used to subject the layer of photoresist resin film 50 to exposure, so that in the exposure process, the reflective blocks 142 correspond to the light transmission zones 91 of the mask plate 90 to allow light to transmit through the light transmission zones 91 of the mask plate 90 to subject the photoresist resin film 50 to exposure, meaning a portion of the photoresist resin film 50 located above and corresponding to each of the reflective blocks 142 is exposed and the reflective block 142 reflects the light to increase exposure intensity of the portion of the photoresist resin film 50 located thereabove; and then, as shown in FIG. 7, subjecting the exposed photoresist resin film 50 to development, wherein since light reflectivity of the metal in an exposure process is better than that of the materials of SiNx and $SiO_2$, the reflective blocks 142 may reflect back the light to make the portions of the photoresist resin film 50 located thereabove more sufficiently exposed so that the portions can be completely removed through development in a development process, meaning the portions of the photoresist resin film 50 that are located above the reflective blocks 142 and have been exposed would be removed to form a first via 551 and a second via 552 located above and corresponding to the reflective blocks 142 to form a photoresist resin layer 55.

Figure 8:
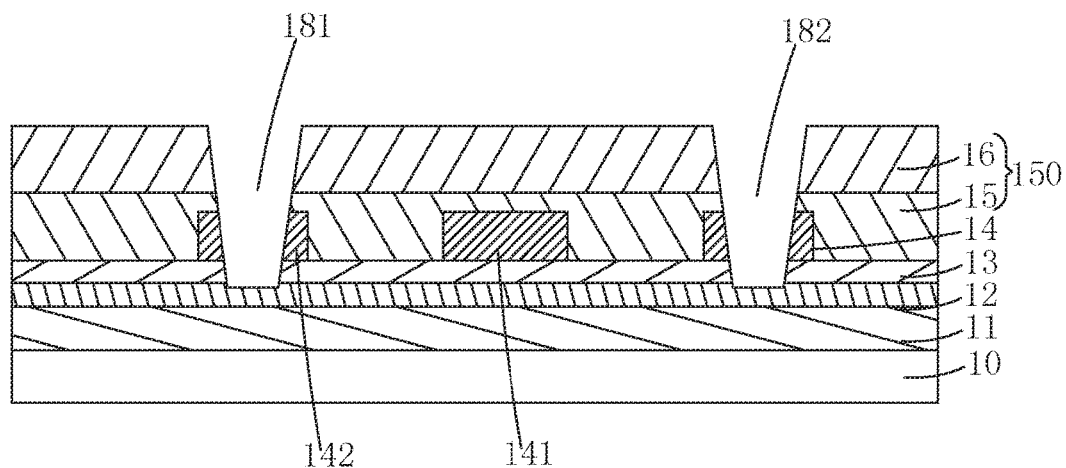
FIG. 8 is a schematic view illustrating Step 5 of the preferred example of the TFT substrate manufacturing method according to the present invention.

Step 5: as shown in FIG. 8, using the photoresist resin layer 55 as a shielding layer to subject the second insulation layer 16, the first insulation layer 15, the gate metal layer 14, and the oxide layer 13 located under the first via 551 and the second via 552 to etching through an etching operation so as to form a first connection hole 181 and a second connection hole 182 extending through the second insulation layer 16, the first insulation layer 15, the gate metal layer 14, and the oxide layer 13 and respectively corresponding to the first via 551 and the second via 552.

Figure 9:
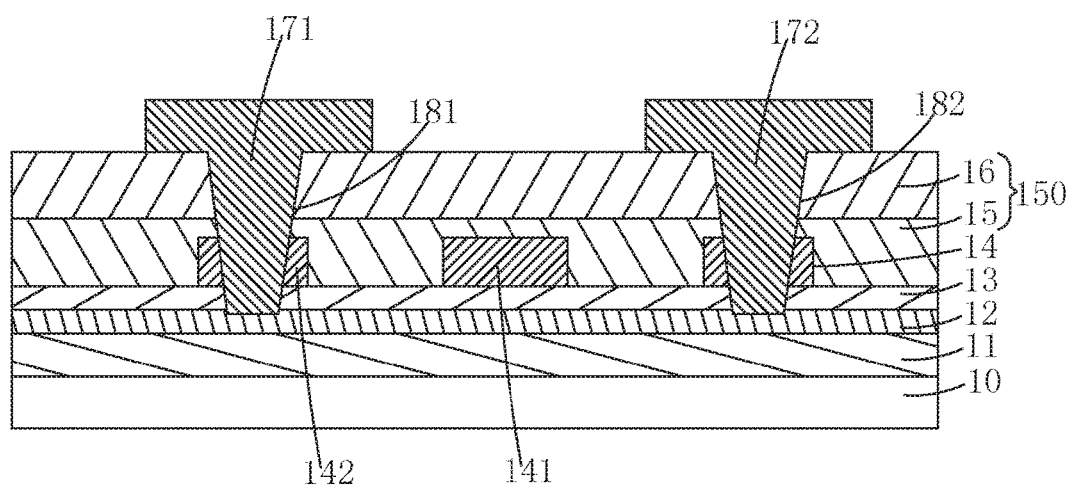
FIG. 9 is a schematic view illustrating Step 6 of the preferred example of the TFT substrate manufacturing method according to the present invention and is also a schematic view illustrating a structure of a preferred example of a TFT substrate according to the present invention.

Step 6: as shown in FIG. 9, forming a source electrode 171 and a drain electrode 172 on the second insulation layer 16 through deposition and patterning operation, wherein the source electrode 171 and the drain electrode 172 are connected to the semiconductor layer 12 through the first connection hole 181 and the second connection hole 182, respectively.

The present invention provides a TFT substrate manufacturing method, which forms reflective blocks 142 in a gate metal layer 14 at locations corresponding to areas in which a first connection hole 181 and a second connection hole 182 are to be formed so that in a process of forming the first connection hole 181 and the second connection hole 182, light is reflected by the reflective blocks 142 to enhance intensity of exposure on portions of a photoresist resin film 50 at location corresponding to the connection holes 142. Thus, even under the condition that limit exposure size of an existing exposure machine is constrained, such as pattern precision of the mask plate 90 being 1 μm, while limit exposure size of the exposure machine being 2 μm, it is still possible to ensure full exposure in forming connection holes in a high PPI display panel device to thereby realize production of high display panel products.

Based on the above-described TFT substrate manufacturing method, the present invention also provides a TFT substrate. Reference is made to FIG. 9, and FIG. 9 is a schematic view illustrating a structure of a preferred example of a TFT substrate according to the present invention. The preferred example comprises a backing plate 10, a buffer layer 11 arranged on the backing plate 10, a semiconductor layer 12 arranged on the buffer layer 11, an oxide layer 13 arranged on the buffer layer 11 and the semiconductor layer 12, a gate metal layer 14 arranged on the oxide layer 13, a first insulation layer 15 arranged on the oxide layer 13 and the gate metal layer 14, a second insulation layer 16 arranged on the first insulation layer 15, and a source electrode 171 and a drain electrode 172 arranged on the second insulation layer 16. The first insulation layer 15 and the second insulation layer 16 collectively form an insulation layer 150.

Specifically, the TFT substrate is provided with a first connection hole 181 and a second connection hole 182. The first connection hole 181 and the second connection hole 182 extend through the second insulation layer 16, the first insulation layer 15, the gate metal layer 14, and the oxide layer 13 at locations above the semiconductor layer 12 and corresponding to reflective blocks 142. The source electrode 171 and the drain electrode 172 are respectively connected to the semiconductor layer 12 via the first connection hole 181 and the second connection hole 182.

Specifically, the gate metal layer 14 comprises a gate electrode 141 and reflective blocks 142 that are arranged to correspond to the first connection hole 181 and the second connection hole 182, respectively. The reflective blocks 142 are not connected to the gate electrode 141.

The reflective blocks 142 are provided to reflect light to enhance exposure intensity on areas located thereabove in a process of forming the first connection hole 181 and the second connection hole 182.

Specifically, the gate metal layer 14 is formed of a material comprising one of molybdenum, titanium, aluminum, and copper or a stacked combination of multiple ones thereof.

Specifically, the gate metal layer 14 is formed through a patterning operation. The patterning operation specifically comprises a photo resist coating process, an exposure process, a development process, an etching process, and a photo resist peeling process that are carried out in sequence.

Specifically, the buffer layer 11 comprises a silicon oxide layer, a silicon nitride layer, or a composite layer formed of stacking silicon oxide layer and silicon nitride layer.

Specifically, the first insulation layer 15 and the second insulation layer 16 are each a silicon oxide layer or a silicon nitride layer.

In summary, the present invention provides a TFT substrate manufacturing method, in which a pattern of the gate metal layer has been designed such that reflective blocks are included in a gate metal layer at locations corresponding to areas in which connection holes are to be formed so that in a process of forming the connection holes, light is reflected by the reflective blocks to enhance intensity of exposure on locations where the connection holes are formed. Thus, even under the condition that limit exposure size of an existing exposure machine is constrained, it is still possible to ensure full exposure in forming the connection holes in a high PPI display panel device to thereby realize production of high display panel products. The present invention provides a TFT substrate, in which a gate metal layer comprises reflective blocks at locations corresponding to connections holes so that in a process of forming the connection holes, light is reflected by the reflective blocks to enhance intensity of exposure on locations where the connection holes are formed. Thus, even under the condition that limit exposure size of an existing exposure machine is constrained, it is still possible to ensure full exposure in forming the connection holes in a high PPI display panel device to thereby realize production of high display panel products.

Based on the description given above, those having ordinary skills in the art may easily contemplate various changes and modifications of the technical solution and the technical ideas of the present invention. All these changes and modifications are considered belonging to the protection scope of the present invention as defined in the appended claims.

What is claimed is:

1. A thin-film transistor (TFT) substrate manufacturing method, comprising the following steps:
   a step of forming a gate metal layer through deposition and patterning, wherein the gate metal layer comprises a gate electrode and reflective blocks, and the reflective blocks and the gate electrode are not connected;
   a step of forming an insulation layer on the gate metal layer;
   a step of forming a photoresist resin layer through forming a complete sheet of photoresist resin film on an entire surface of the insulation layer through coating and subjecting the layer of photoresist resin film to exposure and development, wherein portions of the photoresist resin film that are located above and corresponding to the reflective blocks are exposed and form a first via and a second via; and a step of forming a first connection hole and a second connection hole by applying etching in the first via and the second via with the photoresist resin layer as a shielding layer;

wherein in the step of forming a first connection hole and a second connection hole, the first connection hole and the second connection hole extend through the insulation layer and the reflective blocks of the gate metal layer.

2. The TFT substrate manufacturing method as claimed in claim 1 comprising the following steps:

Step 1: providing a backing plate and sequentially forming a buffer layer, a semiconductor layer, and an oxide layer on the backing plate;

Step 2: forming the gate metal layer on the oxide layer through deposition and patterning;

Step 3: sequentially forming a first insulation layer and a second insulation layer on the oxide layer and the gate metal layer to form an insulation layer that comprises the first insulation layer and the second insulation layer;

Step 4: forming a complete sheet of photoresist resin film on an entire surface of the second insulation layer through coating, and providing a mask plate, wherein the mask plate comprises light transmission zones and a light shielding zone, wherein the mask plate is used to subject the layer of photoresist resin film to exposure, so that in the exposure process, the reflective blocks correspond to the light transmission zones of the mask plate to allow light to transmit through the light transmission zones of the mask plate to subject the photoresist resin film to exposure, whereby a portion of the photoresist resin film located above and corresponding to each of the reflective blocks is exposed and the reflective block reflects the light to increase exposure intensity of the portion of the photoresist resin film located thereabove; and then, subjecting the exposed photoresist resin film to development, so that the exposed portions of the photoresist resin film that are located above the reflective blocks are removed to form a first via and a second via located above and corresponding to the reflective blocks to form a photoresist resin layer;

Step 5: using the photoresist resin layer as a shielding layer to subject the second insulation layer, the first insulation layer, the gate metal layer, and the oxide layer located under the first via and the second via to etching through an etching operation so as to form a first connection hole and a second connection hole extending through the second insulation layer, the first insulation layer, the gate metal layer, and the oxide layer and respectively corresponding to the first via and the second via; and Step 6: forming a source electrode and a drain electrode on the second insulation layer through deposition and patterning operation, wherein the source electrode and the drain electrode are connected to the semiconductor layer through the first connection hole and the second connection hole, respectively.

3. The TFT substrate manufacturing method as claimed in claim 1, wherein the gate metal layer is formed of a material comprising one of molybdenum, titanium, aluminum, and copper or a stacked combination of multiple ones thereof.

4. The TFT substrate manufacturing method as claimed in claim 1, wherein in the step of forming a gate metal layer, the patterning of the gate metal layer comprises carrying out, in sequence, a photo resist coating process, an exposure process, a development process, an etching process, and a photo resist peeling process.

5. A thin-film transistor (TFT) substrate manufacturing method, comprising the following steps:

a step of forming a gate metal layer through deposition and patterning, wherein the gate metal layer comprises a gate electrode and reflective blocks, and the reflective blocks and the gate electrode are not connected;

a step of forming an insulation layer on the gate metal layer;

a step of forming a photoresist resin layer through forming a complete sheet of photoresist resin film on an entire surface of the insulation layer through coating and subjecting the layer of photoresist resin film to exposure and development, wherein portions of the photoresist resin film that are located above and corresponding to the reflective blocks are exposed and form a first via and a second via; and a step of forming a first connection hole and a second connection hole by applying etching in the first via and the second via with the photoresist resin layer as a shielding layer;

wherein the gate metal layer is formed of a material comprising one of molybdenum, titanium, aluminum, and copper or a stacked combination of multiple ones thereof;

wherein in the step of forming a gate metal layer, the patterning of the gate metal layer comprises carrying out, in sequence, a photo resist coating process, an exposure process, a development process, an etching process, and a photo resist peeling process; and wherein in the step of forming a first connection hole and a second connection hole, the first connection hole and the second connection hole extend through the insulation layer and the reflective blocks of the gate metal layer.

6. The TFT substrate manufacturing method as claimed in claim 5 comprising the following steps:

Step 1: providing a backing plate and sequentially forming a buffer layer, a semiconductor layer, and an oxide layer on the backing plate;

Step 2: forming the gate metal layer on the oxide layer through deposition and patterning;

Step 3: sequentially forming a first insulation layer and a second insulation layer on the oxide layer and the gate metal layer to form an insulation layer that comprises the first insulation layer and the second insulation layer;

Step 4: forming a complete sheet of photoresist resin film on an entire surface of the second insulation layer through coating, and providing a mask plate, wherein the mask plate comprises light transmission zones and a light shielding zone, wherein the mask plate is used to subject the layer of photoresist resin film to exposure, so that in the exposure process, the reflective blocks correspond to the light transmission zones of the mask plate to allow light to transmit through the light transmission zones of the mask plate to subject the photoresist resin film to exposure, whereby a portion of the photoresist resin film located above and corresponding to each of the reflective blocks is exposed and the reflective block reflects the light to increase exposure intensity of the portion of the photoresist resin film located thereabove; and then, subjecting the exposed photoresist resin film to development, so that the exposed portions of the photoresist resin film that are located above the reflective blocks are removed to form a first via and a second via located above and corresponding to the reflective blocks to form a photoresist resin layer;

Step 5: using the photoresist resin layer as a shielding layer to subject the second insulation layer, the first insulation layer, the gate metal layer, and the oxide layer located under the first via and the second via to etching through an etching operation so as to form a first connection hole and a second connection hole extending through the second insulation layer, the first insulation layer, the gate metal layer, and the oxide layer and respectively corresponding to the first via and the second via; and Step 6: forming a source electrode and a drain electrode on the second insulation layer through deposition and patterning operation, wherein the source electrode and the drain electrode are connected to the semiconductor layer through the first connection hole and the second connection hole, respectively.

7. The TFT substrate manufacturing method as claimed in claim 2, wherein the gate metal layer is formed of a material comprising one of molybdenum, titanium, aluminum, and copper or a stacked combination of multiple ones thereof.

8. The TFT substrate manufacturing method as claimed in claim 2, wherein in the step of forming a gate metal layer, the patterning of the gate metal layer comprises carrying out, in sequence, a photo resist coating process, an exposure process, a development process, an etching process, and a photo resist peeling process.

* * * * *